US007063756B2

(12) United States Patent
Farquhar et al.

(10) Patent No.: US 7,063,756 B2
(45) Date of Patent: Jun. 20, 2006

(54) ENHANCED DESIGN AND PROCESS FOR A CONDUCTIVE ADHESIVE

(75) Inventors: Donald Seton Farquhar, Endicott, NY (US); Gerald Paul Kohut, Whitney Point, NY (US); Andrew Michael Seman, Kirkwood, NY (US); Michael Joseph Klodowski, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 10/357,950

(22) Filed: Feb. 4, 2003

(65) Prior Publication Data

US 2003/0140488 A1 Jul. 31, 2003

Related U.S. Application Data

(62) Division of application No. 08/864,044, filed on May 28, 1997, now Pat. No. 6,534,724.

(51) Int. Cl.
*B32B 37/04* (2006.01)
*H05K 1/02* (2006.01)
*H01L 21/50* (2006.01)
*H01L 23/00* (2006.01)

(52) U.S. Cl. .......... 156/60; 156/295; 156/297; 156/307.1; 156/325; 174/259; 438/119; 257/783

(58) Field of Classification Search ........... 156/182, 156/295, 297, 299, 306.6, 306.9, 307.1, 307.7, 156/308.2, 47, 48, 60, 150, 311, 325; 29/832, 29/842, 846, 840; 174/250, 255, 256, 259–264, 174/266, 249, 254; 438/118, 119; 257/778, 257/782, 783; 228/179.1
See application file for complete search history.

(56) References Cited

U.S. PATENT DOCUMENTS

| 3,911,169 | A | | 10/1975 | Lesaicherre et al. |
| 3,939,558 | A | * | 2/1976 | Riley ................... 29/832 |
| 4,616,413 | A | | 10/1986 | Iliou et al. |
| 4,727,168 | A | | 2/1988 | Yoshino et al. |
| 4,775,439 | A | * | 10/1988 | Seeger et al. ........... 156/231 |
| 4,963,425 | A | | 10/1990 | Buchanan et al. |
| 4,976,990 | A | | 12/1990 | Bach et al. |
| 5,112,395 | A | | 5/1992 | Ngo |
| 5,172,301 | A | | 12/1992 | Schneider |
| 5,180,625 | A | | 1/1993 | Wang et al. |
| 5,208,188 | A | * | 5/1993 | Newman ............... 156/310 |
| 5,210,941 | A | | 5/1993 | Turek et al. |
| 5,221,399 | A | | 6/1993 | Sanborn et al. |

(Continued)

FOREIGN PATENT DOCUMENTS

GB 2339332 A * 1/2000

(Continued)

OTHER PUBLICATIONS

Methods To Electrically Connect Al Heat Sinks To Semiconductor Chip Packages—IBM Technical Disclosure Bulletin vol. 35 No. 1A Jun. 1992.

(Continued)

*Primary Examiner*—Sue A. Purvis
(74) *Attorney, Agent, or Firm*—A. J. Samodovitz; William N. Hogg

(57) ABSTRACT

The present invention provides a new device and method for enhancing the electrical properties of the thick metal backer/electrically conductive thermoset adhesive/printed circuit board or card assembly. The enhanced electrical properties are obtained by providing a thin bondline of conductive adhesive that is essentially void free.

17 Claims, 1 Drawing Sheet

U.S. PATENT DOCUMENTS

| | | | |
|---|---|---|---|
| 5,261,156 A * | 11/1993 | Mase et al. | 29/832 |
| 5,355,280 A | 10/1994 | Rothlingshofer et al. | |
| 5,362,421 A | 11/1994 | Kropp et al. | |
| 5,366,027 A | 11/1994 | Turek et al. | |
| 5,367,196 A * | 11/1994 | Mahulikar et al. | 257/787 |
| 5,432,303 A | 7/1995 | Turek et al. | |
| 5,448,020 A | 9/1995 | Pendse | |
| 5,455,738 A | 10/1995 | Montesano et al. | |
| 5,490,895 A | 2/1996 | Wang et al. | |
| 5,538,789 A | 7/1996 | Capote et al. | |
| 5,565,267 A | 10/1996 | Capote et al. | |
| 5,605,547 A * | 2/1997 | Lake | 29/25.01 |
| 5,736,783 A * | 4/1998 | Wein et al. | 257/691 |
| 5,741,430 A * | 4/1998 | Dahringer et al. | 216/34 |
| 5,842,273 A * | 12/1998 | Schar | 29/830 |
| 5,920,037 A * | 7/1999 | Jimarez et al. | 174/259 |
| 6,158,115 A * | 12/2000 | Tsukagoshi et al. | 29/832 |
| 6,395,998 B1 * | 5/2002 | Farquhar et al. | 174/260 |
| 2002/0124392 A1 * | 9/2002 | Chung | 29/739 |

FOREIGN PATENT DOCUMENTS

| | | |
|---|---|---|
| JP | 54081353 | 6/1979 |

OTHER PUBLICATIONS

"Process and Performance Advancements in Conductive Bonding of Circuit Cards to Aluminum Thick Metal Backers." Donald Farquhar, Michael Klodowski, Andy Seman and David Light.

Process for Improved Photoresist to Polyimide Adhesion—Reproduced from Research Disclosure, Dec. 1989, No. 308—Kenneth Mason Publications, Ltd. England.

Process for Enhanced Polyimide Adhesion—Reproduced from Research Disclosure, Feb. 1986, No. 262—Kenneth Mason Publications Ltd. England.

* cited by examiner

ENHANCED DESIGN AND PROCESS FOR A CONDUCTIVE ADHESIVE

CROSS REFERENCE TO RELATED APPLICATION

This application is a divisional of application Ser. No. 08/864,044, filed May 28, 1997 now U.S. Pat. No. 6,543,724.

FIELD OF THE INVENTION

The present invention relates to a device and method for forming an improved conductive interconnection between a voltage plane on the back side of a printed circuit card or board and a thick metal heat sink in which flow of the adhesive is limited during lamination.

BACKGROUND OF THE INVENTION

Many modern high power radio frequency or microwave applications require significant current carrying capability and/or significant thermal dissipation. To meet these needs, a thick metal backer ("TMB") is often connected to an external ground plane located on the surface of a printed circuit board ("PCB") to improve the electrical performance of the ground plane and also to provide a heat sink for thermal dissipation. The TMB is essentially flat, but may contain a variety of holes and partial depth cavities for monitoring various types of components. These may or may not be hidden once the printed circuit card is attached. Methods for connecting such a thick metal plate have included sweat soldering, non-conductive adhesive bonding followed by plating through holes for electrical interconnectivity, gold coating the ground plane and applying a silicone adhesive which includes a mixture of silver particles, or by mechanical interconnection such as screws, rivets or soldered pins. Each of these methods have proven less than ideal as they tend to be too costly while compromising performance. Also, some of these methods result in poor reliability in the resulting circuit board assembly.

A more recent method meeting the current carrying and/or thermal dissipation needs required for microwave applications involves treating the surface of the thick metal backer and then adhering the TMB to the PCB with a conductive adhesive. This method includes the steps of preparing a bonding surface of the TMB by grit-blasting to micro-roughen the bonding surface of the TMB. A conductive adhesive such as Ablestik 8175 is screened onto the TMB at a thickness of around 3 mils. The circuit board is placed onto the TMB and a 1 inch diameter roller is rolled across the circuit board to wet it with adhesive. This assembly formed by joining the TMB with the PCB is then placed under pressure in a spring-loaded clamping fixture with pressure exerted at about 1 psi. The assembly contained with the fixture is placed within a belt oven for curing. After curing the assembly is removed from the clamping fixture.

While the micro-roughening method improves the adhesive to thick metal backer interface strength, the low pressure, typically about 1 psi, used during the adhesive curing process may not be sufficient to result in a void free bond line when there is topography on the back side of the circuit board. For instance, the backside of the circuit board may be comprised of bare dielectric material in some places, but have circuit features that are as much as 2 mils (0.002 inches) above the dielectric. Moreover, a 2 mil (0.002 inch) protective coating of solder mask such as Taiyo PSR-4000 or solder mask as described in U.S. Pat. No. 5,026,624 "Composition for Foil Imaging", commonly assigned and incorporated by reference herein, may also be present in selected areas on the backside of the printed circuit card, including areas where there are circuit features. The resulting topography in this example may therefore be as much as 4 mils. Thus, in the particular example when the surface topography of the printed circuit card is comparable to the bondline thickness (3 mils), voiding is likely to occur when using the known methods.

Prior attempts to overcome this problem of voiding due to surface topography have not been satisfactory. For example, the use of higher pressure during the process of laminating the circuit results in excessive squeeze out and flow of the adhesive. This adhesive flow can damage the assembly by creating unwanted electrically conducting pathways, contaminating surface features intended for subsequent use as solder attachments pads, and by changing the overall dimensions of the part if the edge bleed is significant. As another alternative, the use of a vacuum bagging technique to provide good conformance of the card to the TMB has been attempted, but also results in excessive bleed of the adhesive. In another approach, a thicker layer of adhesive is used, but even lower pressure are then required to prevent excess bleed. Moreover, this approach is undesirable because of the high cost of the adhesive, and the increase in electrical resistance associated with a thicker bondline.

Accordingly, a new and useful design for conductively bonding circuit board to a TMB (or to another circuit board) is needed where the appearance of voiding in the interface is eliminated without resorting to thicker adhesive layers. In particular, there is a need for a technique in which the bondline thickness can be less than the surface topography of the circuit card so as to economize on adhesive, and void free bonding is achieved without excessive adhesive bleed.

SUMMARY OF THE INVENTION

In accordance with the present invention, it has been found that partially curing a conductive adhesive after the adhesive has been screened onto a thick metal backer but before attaching the PCB can reduce the formation of trapped air or voids.

Thus, the present invention provides a new design and technique for enhancing the electrical properties of a thick metal backer/conductive adhesive/printed circuit board interface obtained by partially curing the adhesive before application of the PCB to the adhesive. The technique comprises preparing the connection surface of a TMB, screening on a conductive adhesive onto the TMB, partially curing the adhesive and then attaching the PCB for final cure under high pressure.

DETAILED DESCRIPTION

Figure 1:
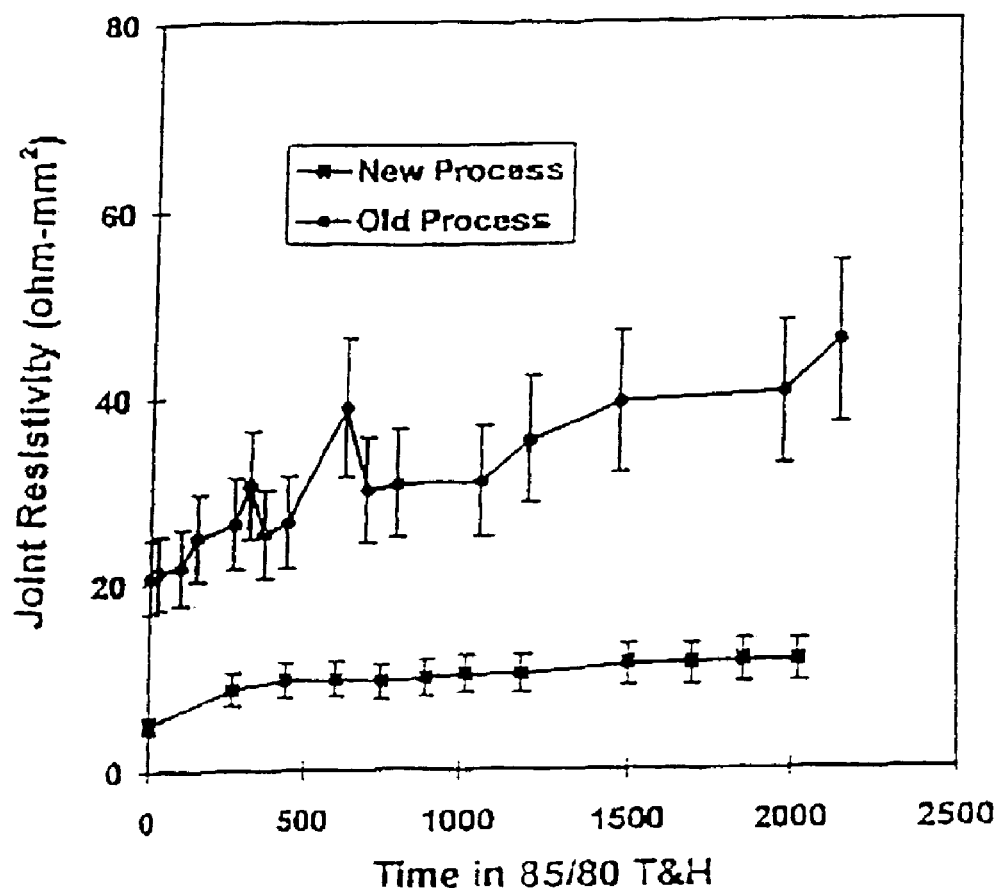
FIGURE 1 is a graphical representation of the results obtained in Example 1 discussed later in this specification.

Conductive bonding of thick metal backers or plates onto a ground plane of a printed circuit board can be accomplished using a variety of conductive adhesives and for a variety of applications. The present invention provides an improved bondline stability while decreasing the amount of conductive adhesive required to form the TMB/PCB assembly. In particular, this improved and thinner bondline is accomplished by partially curing the adhesive before applying the PCB.

When using conductive adhesives to form TMB/PCB assemblies, a connection surface of the TMB is often treated to enhance its connection properties. While typical metals used for a TMB include copper, brass and aluminum, it is preferable to use aluminum for the TMB. However, it is contemplated that other metals including but not limited to copper and brass could be used for the TMB of the present invention. In our embodiment, the treatment used to prepare the connection surface of the TMB for bonding employs vapor-grit blasting the connection surface of the TMB in order to achieve a relatively uniform micro-roughened surface that has a relatively thin oxide layer. While various methods exist for micro-roughening the connection surface, vapor blasting is preferred. Vapor blasting can be defined as spraying under pressure a fine grit abrasive suspended in a medium onto a surface using a spray processing tool which may be conveyorized. One such device is a Liquid Honing Vapor Blast. Baseline conditions for this conveyorized spray processing device are about 70 to 80 psi spray pressure and 1 meter/minute conveyor speed. The spray pressure, however, may be in the range of about 65 to 150 psi while still yielding the desired micro-roughened connection surface. The preferred abrasive materials are aluminum oxide or titanium oxide, in the form of a 320 mesh, present in aqueous slurry at a concentration of about 12%–16% solids by weight.

The adhesive utilized is a thermoset adhesive and is preferably electrically conductive. This includes but is not limited to, isotopically conductive epoxies such as highly loaded silver-flake filled epoxies such as Ablestik 8175 and anisotopically conductive epoxies, for example, epoxies loaded with silver plated nickel particles, silver or gold glass spheres. Preferably, the present invention utilizes conductive epoxy thermoset adhesives in screenable paste form such as Ablestik 8175.

The adhesive is applied to the connection surface of the PCB. A preferred method of applying the adhesive is a screening process in order to achieve coverage over the large surface area which is typical in card bonding applications. Other methods such as rolling, spraying, curtain coating or doctor blading may be acceptable.

Thus, to produce the printed circuit board assemblies with a thick metal backer, the conductive adhesive is screened onto the connection surface of the TMB at a thickness of at least about 0.5 mils and no greater than about 2 mils. Preferably, about 1.5 mils of adhesive is screened onto the TMB.

The adhesive is screened onto the TMB in a "wet" stage. Furthermore, the adhesive is preferably a hardener and resin with no solvent. Thus, when the adhesive is screened on to the PCB, it has low viscosity. Once the adhesive is laid down onto the connection surface of the PCB, it is partially cured or "b-staged." The b-staging of the adhesive partially cures the adhesive and therefore increases its viscosity. Thus, the subsequent flow upon application of heat and pressure of the adhesive is reduced, thus, when the PCB is placed into contact with the adhesive and subjected to heat or pressure, adhesive bleed or squeeze-out is reduced.

B-staging partially advances the curing of the adhesive to an intermediate degree. The curing process can be characterized by physical properties including viscosity, molecular weight, cross-link density, shear modulus and glass transition temperature. As the amount of cure increases, all of these properties also increase. When a thermoset adhesive is cured molecules react with other molecules to ultimately form chains or networks of molecules. When the system is fully reacted, so that a continuous network of molecules is formed, it is considered fully cured. However, when the adhesive is only partially cross-linked, the system is only partially cured or "b-staged." This b-staging process can be accomplished by application of heat or by exposure to actinic radiation if the thermoset adhesive is photo-sensitive. Upon subsequent heating, the system may be rendered fully cured.

As stated above, one method of determining the degree of cure is to measure the viscosity of the adhesive. The starting viscosity of the preferred adhesive is less then 100 Pa-S. This viscosity allows for easy screening of the adhesive. The adhesive is b-staged to partially cure the adhesive. After b-staging, if the viscosity is measured, a b-staged adhesive will have a viscosity about 100 to about 1000 Pa-S. A viscosity in the above range corresponds to about 20 to 60% of a full cure which constitutes a b-stage cure. At this cure, the adhesive is essentially dry to touch or tacky at room temperature. The curing process will continue only very slowly at room temperature.

Once the adhesive is partially cured, the PCB is aligned with and then attached to the TMB/adhesive. The TMB/adhesive/PCB assembly is then laminated in a flat bed lamination press at about 50 to about 200 psi at a cure temperature of about 100° C. to 150° C. Preferably, the cure temperature is about 110° C. to about 140° C. with optimal results achieved at about 130° C. By b-staging, the flow of the adhesive is limited and undesirable affects such as squeeze-out are eliminated. Even if some topography exists on the PCB, such as circuit lines or solder mask, the adhesive will conform and fill effectively surround these features because a higher lamination pressure may be used due to the higher viscosity of the b-staged adhesive. If there is protective coating or solder mask on some of the circuitry, it will also tend to soften and deform, further accommodating the surface topography. Note that adhesive will tend to flow from areas of high pressure to low pressure, thus tending to fill into voids. The use of higher pressure allows for a thinner bondline in which the higher lamination pressure eliminates voiding throughout the bondline. This is particularly beneficial because of the economic benefit of using less adhesives.

One means of discerning the voiding in the bondline is through the use of x-ray photography. The x-ray image reveals a gray scale which corresponds to physical density of the cross-section. Owing to the fact that the silver filler in the adhesive is very dense compared to aluminum, copper, and the other dielectric components, its presence (or absence) shows clearly in an x-ray photograph in spite of the thinness of the bondline layer which contains the silver. The high pressure process herein disclosed shows no heterogeneity or voiding in the bondline of any dimension greater than surface topography of the printed circuit card (about 2 mils). In contrast, the low pressure lamination process shows heterogeneity on a much greater scale, apparently a result of non-uniformity in the bondline thickness and the presence of voiding. This low pressure is typical of the prior art practice.

EXAMPLES

In order to more thoroughly illustrate the present invention, the following example was constructed. The TMB and PCB were bonded together according to the above explained invention. The electrical properties were tested by placing the circuit board assembly in a chamber maintained at 85° C.

and 80% relative humidity. Electrical resistance was measured. Also, the experiment in each example was repeated a number of times to establish the significance of the result.

Example 1

In this example, one set of circuit board assemblies ("sample 1") had adhesive screened onto the connection surface of the TMB and partially cured before the PCB was attached, while a second set of circuit board assemblies ("sample 2") was formed without partially curing the adhesive using 3 mils of adhesive and low pressure (1–2 psi) clamping, according to that known in the art. Once the samples were formed, their resistance over time while exposed to 80% relative humidity was tested.

As shown in FIGURE 1, the joint resistivity after 1000 hours of T&H testing of sample 1 is 10.1 ohm-mm$^2$, a 2.5× improvement over the about 30 ohm-mm$^2$ joint resistivity of sample 2. After 2000 hours, sample 1 evidenced a joint resistivity of 11.5 ohm-mm$^2$. This represents a 4× improvement over the joint resistivity of about 45 ohm-mm$^2$ of sample 2 after 2000 hours. Another means of quantifying the performance is the electrical resistance after wet thermal shock testing in which comparable improvement was observed.

A further benefit of this bonding process is that a greater variety of surface finishes can be used on the TMB and printed circuit card or board. This is a result of the higher lamination pressure, and the resulting more complete contact of the adhesive with the surface. In the prior art, a tin surface was deposited on top of the gold plating on the circuit lines of the printed circuit card, in order to achieve acceptable bonding strength and reliability. While the deposition of tin resulted in additional expense, it was necessitated because the gold surface did not provide sufficient bond strength or reliability. However, with the higher pressure bonding process thus described, while a slight decrease in mechanical adhesion strength results from the use of gold surface, electrical performance and long term reliability equivalent to that achieved with a tin surface was obtained.

Although only a few embodiments of the present invention have been described above, it should be appreciated that many modifications can be made without departing from the spirit and scope of the invention. For instance, two components such as two printed circuit boards or cards could be attached instead of a thick metal backer being attached to the board or card. All such modifications are intended to be included within the scope of the present invention, which is to be limited only by the following claims.

We claim:

1. A method for manufacturing an electrical component comprising:
    applying an electrically conductive thermoset adhesive paste onto essentially an entire bonding surface of a metal substrate;
    thereafter partially curing said adhesive;
    attaching a circuit board to said adhesive to form a substrate/adhesive/circuit board assembly;
    laminating said assembly in a lamination press to form an electrical component; and
    wherein said adhesive is about 20% to about 60% fully cured.

2. The method of claim 1 wherein said bondline between the substrate and circuit board assembly formed by the adhesive has a thickness of at least about 0.5 mil.

3. The method of claim 1 wherein said bondline between the substrate and circuit board assembly formed by the adhesive has a thickness of no greater than about 2 mils.

4. The method of claim 1 wherein said bondline between the substrate and circuit board assembly formed by the adhesive has a thickness of at least about 0.5 mil and no greater than about 2 mils.

5. The method of claim 1 wherein said metal substrate is aluminum.

6. The invention as defined in claim 1 wherein the adhesive paste is applied by screen coating.

7. The invention as defined in claim 1 wherein the lamination pressure is from about 50 psi to about 200 psi.

8. The invention as defined in claim 1 wherein the lamination temperature is from about 100° C. to 150° C.

9. A method of manufacturing an electrical component comprising:
    applying an electrically conductive thermoset adhesive onto essentially an entire bonding surface of a metal substrate;
    thereafter partially curing said adhesive;
    attaching a circuit board to said adhesive to form a substrate/adhesive/circuit board assembly;
    laminating said assembly in a lamination press to form an electrical component; and
    wherein said partially cured adhesive has a viscosity of at least about 100 Pa-S to no more than about 1000 Pa-S.

10. The method of claim 9 wherein said bondline between the substrate and circuit board assembly formed by the adhesive has a thickness of at least about 0.5 mil.

11. The method of claim 9 wherein said bondline between the substrate and circuit board assembly formed by the adhesive has a thickness of no greater than about 2 mils.

12. The method of claim 9 wherein said bondline between the substrate and circuit board assembly formed by the adhesive has a thickness of at least about 0.5 mil and no greater than about 2 mils.

13. The method of claim 9 wherein said metal substrate is aluminum.

14. The method of claim 9 wherein said bondline between the substrate and circuit board assembly formed by the adhesive has a thickness of at least about 0.5 mil.

15. The method of claim 9 wherein said bondline between the substrate and circuit board assembly formed byte adhesive has a thickness of no greater than about 2 mils.

16. The method of claim 9 wherein said bondline between the substrate and circuit board assembly formed by the adhesive has a thickness of at least about 0.5 mil and no greater than about 2 mils.

17. The method of claim 9 wherein said metal substrate is aluminum.

* * * * *

UNITED STATES PATENT AND TRADEMARK OFFICE
CERTIFICATE OF CORRECTION

| | |
|---|---|
| PATENT NO. | : 7,063,756 B2 |
| APPLICATION NO. | : 10/357950 |
| DATED | : June 20, 2006 |
| INVENTOR(S) | : Farquhar et al. |

It is certified that error appears in the above-identified patent and that said Letters Patent is hereby corrected as shown below:

Claim 2
Column 6, line 4, change "funned" to --formed--,

Claim 15
Column 6, line 49, change "byte" to --by the--.

Signed and Sealed this

Fifth Day of September, 2006

JON W. DUDAS
*Director of the United States Patent and Trademark Office*